United States Patent
Tamaki

Patent Number: 5,822,260
Date of Patent: Oct. 13, 1998

[54] SEMICONDUCTOR MEMORY DEVICE

[75] Inventor: Satoshi Tamaki, Tokyo, Japan

[73] Assignee: NEC Corporation, Tokyo, Japan

[21] Appl. No.: 946,355

[22] Filed: Oct. 7, 1997

[30] Foreign Application Priority Data

Oct. 8, 1996 [JP] Japan .................................. 8-267436

[51] Int. Cl.⁶ .................................................. G11C 7/00
[52] U.S. Cl. ........................ 365/203; 365/204; 365/190
[58] Field of Search .................................... 365/203, 205, 365/207, 204, 190

[56] References Cited

U.S. PATENT DOCUMENTS

| 5,636,169 | 6/1997 | Oh ............................................. 365/203 |
| 5,650,970 | 7/1997 | Kai ............................................ 365/203 |
| 5,703,816 | 12/1997 | Nam et al. .............................. 365/203 |

FOREIGN PATENT DOCUMENTS 5-258568  10/1993  Japan .

Primary Examiner—Vu A. Le
Attorney, Agent, or Firm—Sughrue, Mion, Zinn, Macpeak & Seas, PLLC

[57] ABSTRACT

Disclosed is a semiconductor memory device capable of shortening a precharge time and increasing a read out speed by increasing a difference potential between complementary read out data relating to a sensitivity of a data amplifier. In the semiconductor memory device, provided is a precharge control circuit which receives a precharge enable signal for controlling a precharge operation of a pair of read out signal lines, detects potentials of first and second reading-out signals generated on the pair of read out signal lines, and controls turning-on/off of first and second transistors which control a precharge operation for said pair of read out signal lines.

3 Claims, 5 Drawing Sheets

SEMICONDUCTOR MEMORY DEVICE

BACKGROUND OF THE INVENTION

1. Field of the Invention

The present invention relates to a semiconductor device, more particularly to a semiconductor memory device such as a DRAM(Dynamic Randam Access Memory) having a dynamic type of data amplifier in its read bus.

2. Description of the Prior Art

A read out circuit of a conventional semiconductor memory devices has complementary read out signal lines transmitting complementary bit data from a plurality of column selection circuits to a data amplifier, the complementary bit data having been subjected to a sense amplification and a column selection. A precharging P-channel transistor is provided on a data amplifier side of these read out signal lines, which is designed such that it clamps a power potential at the time of precharging. At the time of a read out operation, the above-described P-channel transistor is enabled, whereby a predetermined precharging is performed and the difference of bit data potentials generated between the read out lines is amplified to be supplied to the data amplifier.

The P-channel transistor operates in the foregoing manner at the time of the read out operation. In order to reduce an operation current of this P-channel transistor, it is effective to reduce a size of the P-channel transistor. However, when the reduction in the operation current of the P-channel transistor is carried out, there has been a problem that a precharging speed is lowered so that a read out speed becomes slow.

In FIG. 1, a circuit diagram of the foregoing read out circuit of the conventional semiconductor memory device, including a block, is shown. Referring to FIG. 1, the conventional semiconductor memory device comprises a plurality of column selection circuits 1, each of which selects complementary bit lines B1 and B2 in response to a supply of a column selection signal C and outputs data r1 and r2 to complementary read out signal lines R1 and R2; a data amplifier 2 which energizes the data r1 and r2 to amplify them in response to a supply of a data amplification enable signal DA and outputs a read out data DO; P-channel transistors P1 and P2, each of which has a source connected to a power source and a drain connected to a corresponding one of read out signal lines R1 and R2 and has a gate supplied with a precharge enable signal P; and N-channel transistors N1 and N2, one terminal of a source and a drain of which is connected to the corresponding one terminal of the read out signal lines R1 and R2 and the other terminal of the source and the drain of which is connected to a corresponding complementary input terminal of the data amplifier 2, and each gate of which is supplied with a transfer gate enable signal GA to operate as a transfer gate.

The column selection circuit 1 comprises a sense amplifier 11 which amplifies the difference potential of bit data b1 and b2 of complementary bit lines B1 and B2; N-channel transistors N11 and N12, each of which has a gate supplied with a column selection signal CS and has a drain connected to corresponding one of the read out signal lines R1 and R2; and N-channel transistors N13 and N14, each of which has a gate connected to a corresponding one of the bit lines B1 and B2, a drain connected to corresponding one of the sources of the transistors N11 and N12, and a source connected to the ground potential.

Next, an operation of this semiconductor memory device will be described with reference to FIG. 2 in which each of signal wave shapes of FIG. 1 is illustrated by a time chart.

As shown in FIG. 2, when the precharge enable signal P is made high H in level, the transistors P1 and P2 come into a conductive state in response to a change of this signal P to be high H in level. Upon the change of the transistors P1 and P2 to be the conductive state, the read out signal lines R1 and R2, which have been at a ground potential by connecting the ground through the transistors N11 and N14, are clamped at the power potential.

On the other hand, the bit lines B1 and B2 are supplied with the bit data b1 and b2, each being at a different potential from the other. For convenience of the description, it is assumed that the data b1 is amplified to the power source potential and the data b2 is amplified to the ground potential. One bit data b1 is amplified to the power source potential and the other bit data b2 is amplified to the ground potential by the sense amplifier 11, respectively. And, then, the difference potential of the bit data b1 and b2 is gradually increased. Here, when the column selection signal CS is made high in level to be enabled, the transistors N11 and N12 will be turned on and the transistors N13 and N14 will be turned on while varying the conduction resistance by the difference potential of the bit date b1 and b2. Here, the transistors N11 and N13 connected in series will be perfectly turned on and the transistors N12 and N14 will be perfectly turned off.

As in the manner described above, the difference potential of the bit data b1 and b2 which is amplified by the sense amplifier 11 is transmitted to each of the read out signal lines R1 and R2 through the corresponding one of the lines. One line is connected to the transistors N11 and N13 in series and the other line is to the transistors N12 and N14 in series connected. At the same time, the precharge enable signal P is disabled, that is, the signal P is made low in level, whereby the transistors P1 and P2 are turned off. The bit data b1 and b2 transmitted to the read out signal lines R1 and R2 are boosted up to a predetermined potential keeping the potential difference, and the bit data b1 and b2 are generated as read out data r1 and r2. Here, when a transfer gate enable signal GA and a data amplifier enable signal DA are enabled, the read out data r1 and r2 are supplied to the data amplifier 2. The data amplifier 2 amplifies the difference potential of the read out data r1 and r2 to output a read out signal DO.

In the foregoing read out circuit, the difference potential of the read out data r1 and r2 is determined by adjusting the size of the transistors P1 and P2, namely, the channel length W of them. Here, when the channel length W of the transistors P1 and P2 is made small, the difference potential of the read out data r1 and r2 becomes larger, so that it will be possible to increase the sensitivity of the data amplifier 2. However, the time until a potential required for an operation of the data amplifier 2 is obtained is prolonged, specifically, the access time ta is prolonged, thereby lowering the precharing speed. On the contrary, when the channel length W is made larger, the access time ta is reduced, so that the precharing speed is increased. However, the sensitivity of the data amplifier 2 is lowered.

As described above, the difference potential of the complementary read out data having effect on the sensitivity of the data amplifier and the access time relating to the precharing time depend on the channel length W of the precharging P-channel transistor. For this reason, in the conventional semiconductor memory device in which the channel length is designed by a trade-off between the precharing time and the sensitivity of the data amplifier, there has been a drawback that a shortening of the precharing time and an increase in the read out speed are limited.

SUMMARY OF THE INVENTION

The objects of the present invention are to provide a semiconductor memory device capable of shortening a precharging time and increasing a read out speed by increasing a difference potential of complementary read data relating to a sensitivity of a data amplifier.

In order to achieve the foregoing objects, a semiconductor memory device of the present invention comprises:

a plurality of column selection circuits, each of which selects a pair of complementary bit lines in response to a supply of a column select signal and outputs complementary first and second read out data to corresponding complementary first and second read out signal lines;

a data amplifier which is enabled in response to a supply of a data amplifier enable signal to amplify said first and second read out data and outputs read out data;

first and second transistors of one conductivity type, each of which has a source connected to a power source and a drain connected to corresponding one of said first and second read out signal lines;

third and fourth transistors of an opposite conductivity type of said one conductivity type, one current path of which is connected to corresponding one of said first and second read out signal lines, the other current path of which is connected to corresponding one of complementary input terminals of said data amplifier, said third and fourth transistors being turned on in response to a supply of a transfer gate enable signal to each gate thereof; and a precharge control circuit which receives a precharge enable signal for controlling a precharge operation of said read out signal lines and detects each potential of said first and second reading-out data to control supplies of first and second driving signals for driving each gate of said first and second transistors.

In the semiconductor memory device of the present invention, the precharge control circuit comprises:

a first NAND gate which has one input terminal receiving said first read out data and the other input terminal receiving a second logic signal, said first NAND gate outputting a first logic signal;

a second NAND gate which has one input terminal receiving said second read out data and the other input terminal receiving said first logic signal, said second NAND gate outputting said second logic signal; and third and fourth NAND gates, each having one input terminal receiving one of said first and second logic signals and the other input terminal receiving said precharge enable signal, said third and fourth NAND gates outputting said first and second driving signals.

Moreover, the semiconductor memory device further comprises:

fifth and sixth transistors of the first conductivity type, each having a source connected to said power source and a drain connected to the corresponding one of said first and second read out lines, said fifth and sixth transistors being turned on upon receipt of said precharge enable signal at each gate thereof and having a channel length smaller than that of said first and second transistors.

Since the semiconductor memory device of the present invention comprises the precharge control circuits which receives the precharge enable signal and detects each of potentials of the complementary read out data to control the supply of the gate driving signals to the firs and second P-channel transistors for precharging, the precharge time can be reduced and the difference potential of the read out signal lines can be larger, by making the channel length of said P-channel transistors larger. Thus, the read out speed of the data amplifier can be increased.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

Next, embodiments of a semiconductor memory device of the present invention will be described with reference to the accompanying drawings in detail.

Figure 3:
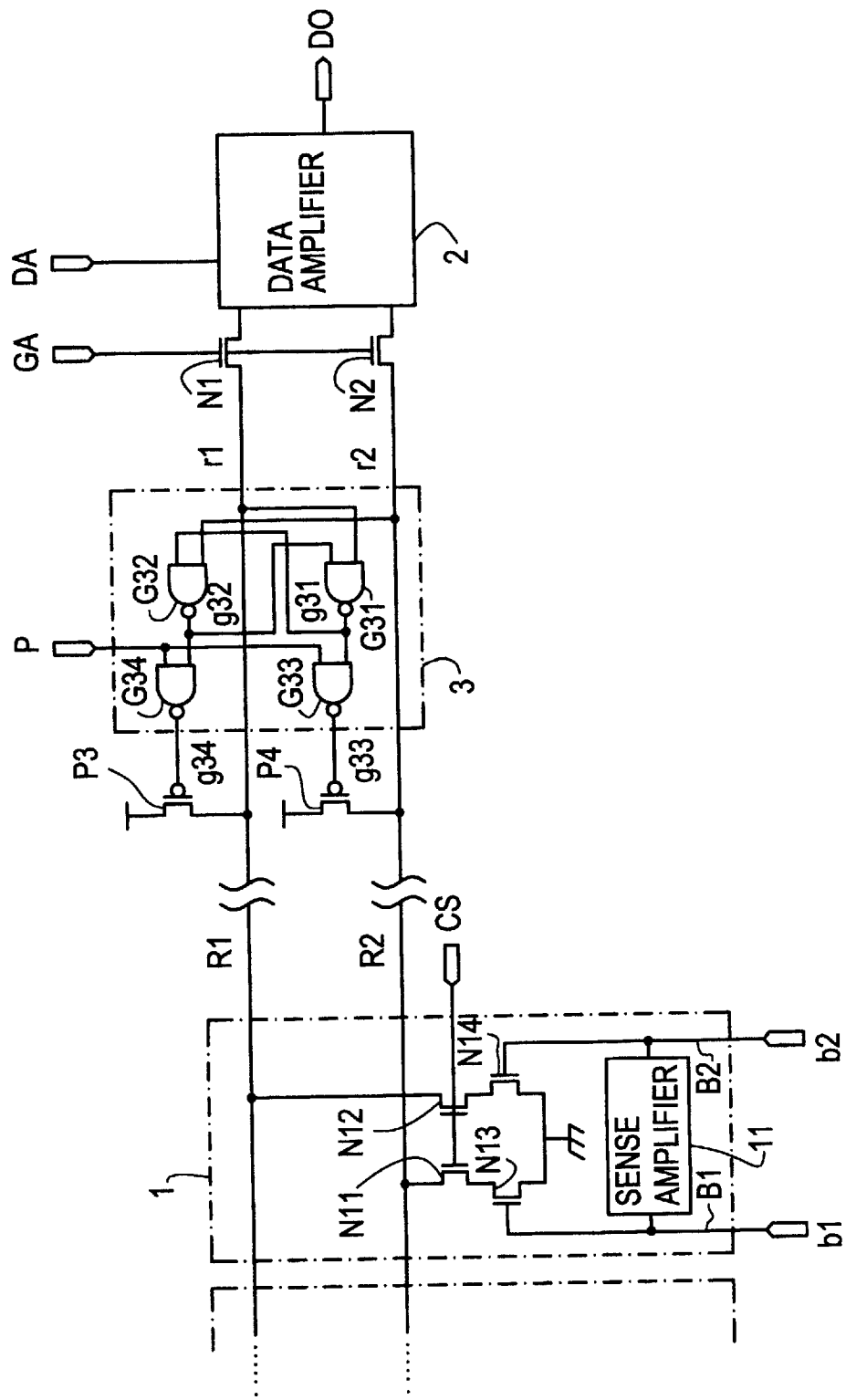
FIG. 3 is a block diagram showing a first embodiment of a semiconductor memory device of the present invention.

In FIG. 3, a circuit diagram including a block of a read out circuit in a semiconductor memory device of a first embodiment of the present invention. In the circuit configuration, the common constitutional components to those of FIG. 1 are denoted by the same characters and reference numerals.

Figure 1:
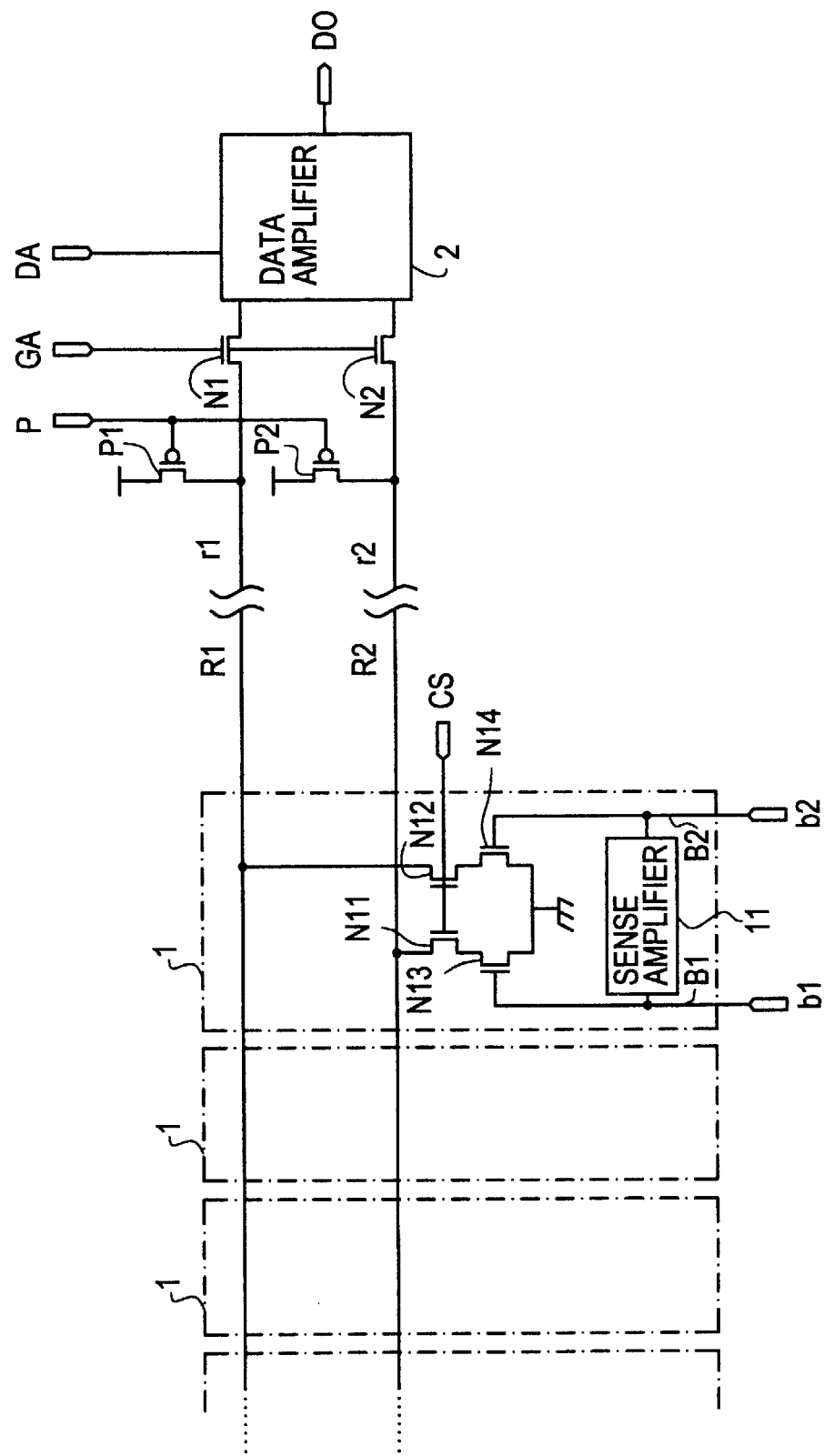
FIG. 1 is a block diagram showing an example of a conventional semiconductor memory device.
Figure 2:
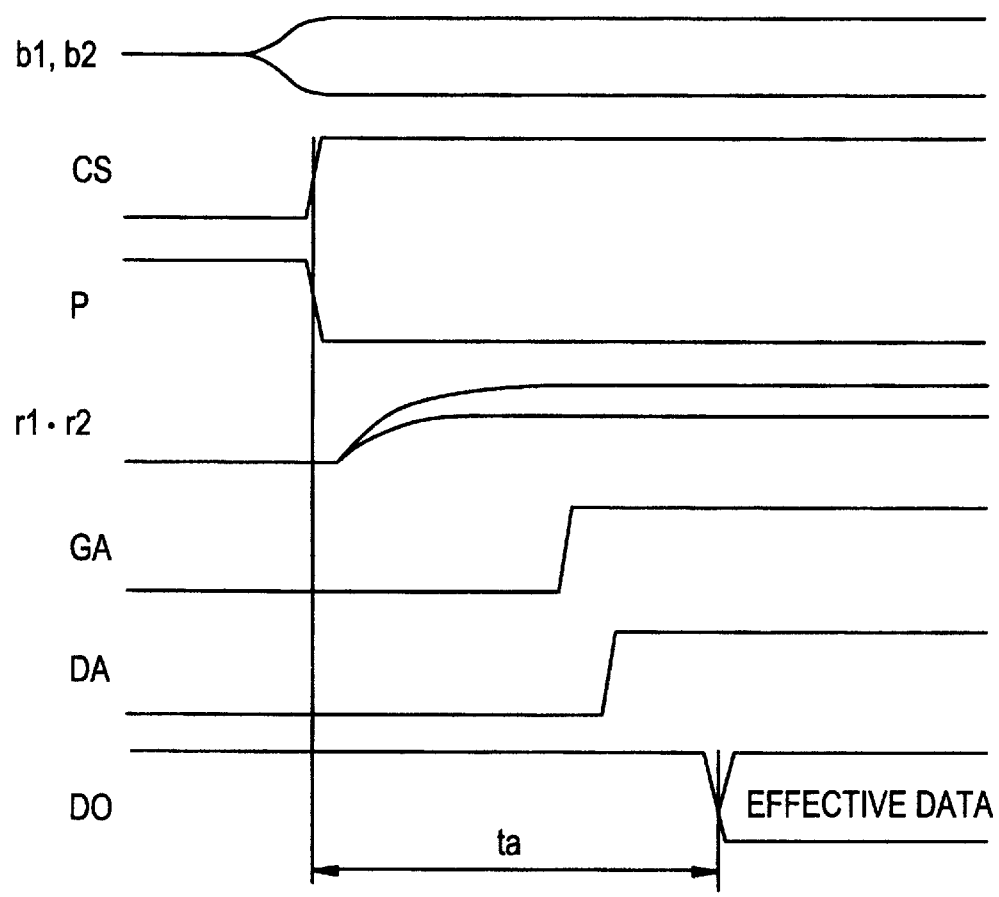
FIG. 2 is a timing chart showing an example of an operation of the conventional semiconductor memory device.

Referring to FIG. 3, the semiconductor memory device of this embodiment comprises P-channel transistors P3 and P4 having a channel length larger than that of the conventional transistors P1 and P2 for precharging; and a precharge control circuit 3 which detects potentials of read out signals r1 and r2 to control a supply of a precharge enable signal which drives the gates of the P-channel transistors P3 and P4, in addition to the column select circuit 1, the data amplifier 2 and the transistors N1 and N2, which are similar to those in the conventional semiconductor memory device shown in FIG. 1.

The precharge control circuit 3 comprises two-input NAND gates G31 and G32 connected to each other such that each receives corresponding one of the read out signals r1 and r2 in one input terminal and receives an output from the other NAND gate in the other input terminal, the NAND gates outputting signals g31 and g32, respectively; and two-input NAND gates G33 and G34, each of which receives corresponding of the signals g31 and g32 in one input terminal and receives a precharge enable signal P in the other input terminal, the NAND gates G33 and G34 outputting signals g33 and g34 for driving gates of the transistors P3 and P4, respectively.

Figure 4:
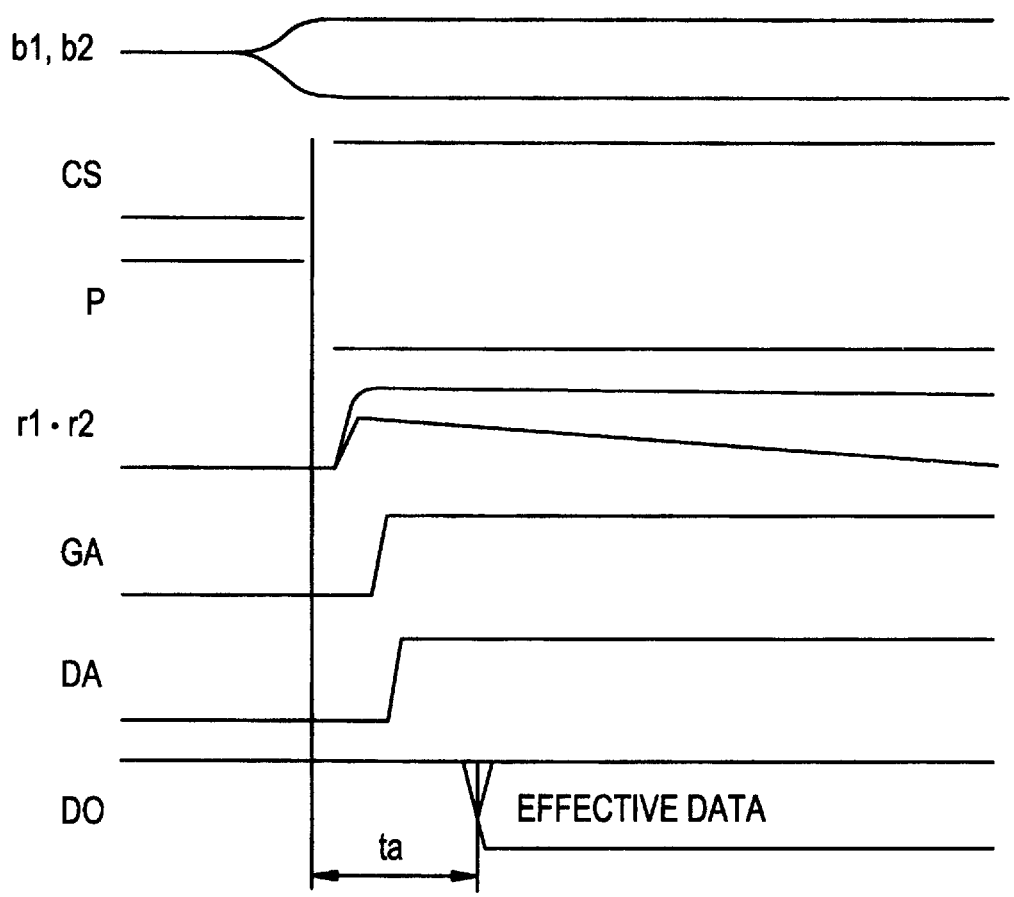
FIG. 4 is a timing chart showing an example of an operation of the semiconductor memory device of the first embodiment of the present invention.

Next, an operation of the semiconductor memory device of this embodiment will be described with reference to FIG. 3 and FIG. 4 showing the signal wave shapes with timing charts.

First, when the precharge enable signal P is changed to be high H in level, the transistors P3 and P4 are turned on in response to the high level H of the precharge enable signal. The read out lines R1 and R2 are previously grounded through the transistors N11 and N14, and the read out lines R1 and R2 are at the grounded potential, until the transistors P3 and P4 are turned on. The read out lines R1 and R2 are supplied with charges from the power source when the transistors P3 and P4 at the turned-on state. The lines R1 and R2 are clamped at the power source potential.

On the other hand, the bit lines B1 and B2 are being supplied with bit data b1 and b2, each being at a different potential from the other. For convenience of the description, it is assumed that the data b1 is amplified to the power source potential and the data b2 is amplified to the ground potential, respectively. Specifically, one bit data b1 is amplified to the power source potential and the other bit data b2 is amplified to the ground potential by the sense amplifier 11, whereby the difference potential of the bit data b1 and b2 is gradually increased. Here, when the column select signal CS is enabled by changing the signal CS to be high H in level, the transistors N11 and N12 are turned on, and the transistors N13 and N14 are turned on while changing the turning-on resistance thereof corresponding to the potential difference of the bit data b1 and b2. In the circuit of the semiconductor memory device of this embodiment, the transistors N11 and N12 connected in series are completely turned on and the transistors N12 and N14 are completely turned off.

In such manner described above, the potential difference of the bit data b1 and b2 amplified by the sense amplifier 11 is transmitted to each of the read out signal lines R1 and R2 through the line connected in series to the transistors N11 and N13 and the line connected in series to the transistors N12 and N14. These read out signal lines R1 and R2 are charged so that the lines R1 and R2 are at the power source potential, while keeping the difference potential, whereby the read out signals r1 and r2 are generated. Here, in this embodiment, the channel length of the transistors P3 and P4 are set to be sufficiently larger than that of the transistors P1 and P2 in the conventional semiconductor memory device, whereby the read out signal lines R1 and R2 will be rapidly charged. Moreover, of the read out signal lines R1 and R2, the read out signal line R2 connected to the transistor N14 having a turning-on resistance larger than that of the transistor N12 will be charged more rapidly than the read out signal line R1.

Therefore, in this embodiment, the read out signal r2 rises up more faster than the signal r1, it will exceed the threshold potential of the NAND gate G32 of the precharge control circuit 3. When the read out signal r2 exceeds the threshold potential of the NAND gate G32, the output signal g32 from the NAND gate G32 is made low L in level, the output signal g34 from the NAND gate G34 is changed to be high H in level, in response to the change of the signal g32 to the low level. When the output signal g34 changes to be high H in level, the transistor P3 is cut off, whereby the read out signal line R1 stops its charging, which is charged more slowly.

In case of this embodiment, while the read out signal line R2 charged more rapidly than the line R1 is charged without interruption, the read out signal line R1 is discharged to the ground potential via the transistors N13 and N14 upon the pause of charging. Therefore, the difference potential between the signals r1 and r2 is made increasingly large. Specifically, in this embodiment, by setting the channel length of the transistors P3 and P4 to be large, the precharging speed of the read out signal lines R1 and R2 can be increased. When one of the potentials of the read out signal lines R1 and R2 exceeds the threshold potential of the NAND gates G31 and G32 of the precharge control circuit 3, the difference potential between the signals r1 and r2 are further increased. Thus, the read out operation of the data amplifier 2 can be performed more quickly.

Figure 5:
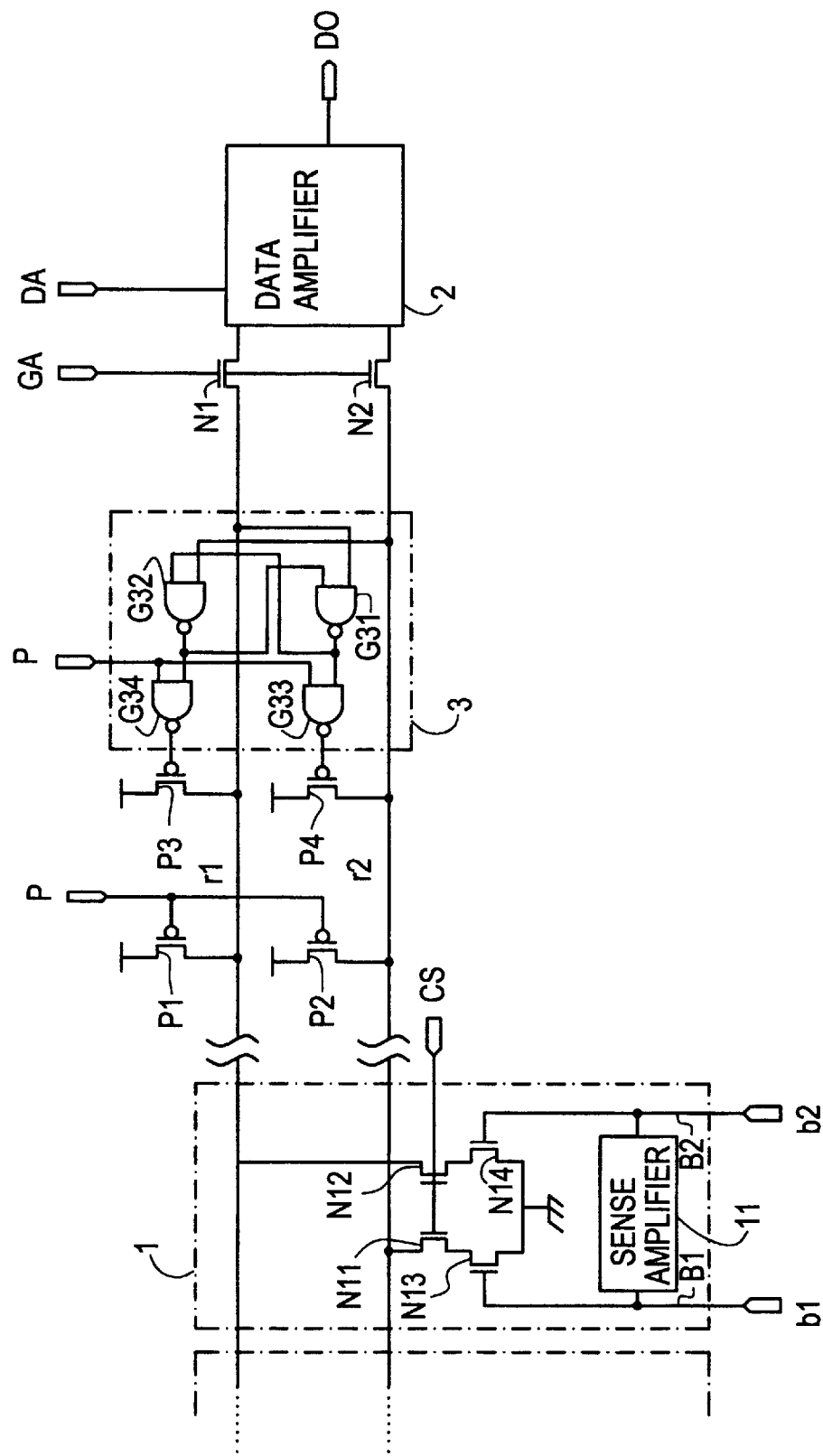
FIG. 5 is a block diagram showing a second embodiment of a semiconductor memory device of the present invention.

Next, a semiconductor memory device of a second embodiment of the present invention will be described below. In FIG. 5, a circuit diagram including a block of a read out circuit in the semiconductor memory device of the second embodiment of the present invention is shown. In the configuration of the circuit diagram shown in FIG. 5, the common components to those of the foregoing circuit diagram shown in FIG. 3 are denoted by the same characters and reference numerals.

The semiconductor memory device of the second embodiment is differs from that of the first embodiment in that the precharge transistors P1 and P2 used for the conventional semiconductor memory device are further provided. With such configuration, after the precharge operation by the transistors P3 and P4 is completed, the operation current at the read out can be reduced while keeping the difference potential between the signals r1 and r2 approximately constant.

What is claimed is:

1. A semiconductor memory device comprising:
    a plurality of column selection circuits, each of which selects a pair of complementary bit lines in response to a supply of a column selection signal and outputs complementary first and second read out data to corresponding complementary first and second read out signal lines;
    a data amplifier which is enabled in response to a supply of a data amplifier enable signal to amplify said first and second read out data and outputs said first and second read out data;
    first and second transistors of one conductivity type, each of which has a source connected to a power source and a drain connected to corresponding one of said first and second read out signal lines;
    third and fourth transistors of an opposite conductivity type of said one conductively type, one current path of which is connected to corresponding one of said first and second read out signal lines, the other current path of which is connected to corresponding one of complementary input terminals of said data amplifier, said third and fourth transistors being turned on in response to a supply of a transfer gate enable signal to each gate thereof; and
    a precharge control circuit which receives a precharge enable signal for controlling a precharge operation of said read out signal lines and detects each potential of said first and second read out data to control supplies of first and second driving signals for driving each gate of said first and second transistors.

2. The semiconductor memory device according to claim 1, wherein the precharge control circuit comprises:
    a first NAND gate which has one input terminal receiving said first read out data and the other input terminal receiving a second logic signal, said first NAND gate outputting a first logic signal;
    a second NAND gate which has one input terminal receiving said second read out data and the other input terminal receiving said first logic signal, said second NAND gate outputting said second logic signal; and
    third and fourth NAND gates, each of which has one input terminal receiving one of said first and second logic signals and the other input terminal receiving said precharge enable signal, said third and fourth NAND gates outputting said first and second driving signals.

3. The semiconductor memory device according to claim 1, further comprising fifth and sixth transistors of the first conductivity type, each of which has a source connected to said power source and a drain connected to said first and second read out signal lines, said fifth and sixth transistors being supplied with said precharge enable signal to turn on and having a channel length smaller than that of said first and second transistors.

* * * * *